(12) United States Patent
Kelley et al.

(10) Patent No.: US 9,119,289 B2
(45) Date of Patent: Aug. 25, 2015

(54) FILM CONSTRUCTIONS FOR INTERDIGITATED ELECTRODES WITH BUS BARS AND METHODS OF MAKING SAME

(71) Applicant: 3M INNOVATIVE PROPERTIES COMPANY, St. Paul, MN (US)

(72) Inventors: Tommie W. Kelley, Shoreview, MN (US); Martin B. Wolk, Woodbury, MN (US); Terence D. Neavin, Saint Paul, MN (US); Stephen A. Johnson, Woodbury, MN (US); Arthur L. Fry, Maplewood, MN (US); Audrey A. Sherman, Saint Paul, MN (US)

(73) Assignee: 3M INNOVATIVE PROPERTIES COMPANY, Saint Paul, MN (US)

( * ) Notice: Subject to any disclaimer, the term of this patent is extended or adjusted under 35 U.S.C. 154(b) by 276 days.

(21) Appl. No.: 13/775,415

(22) Filed: Feb. 25, 2013

(65) Prior Publication Data
US 2014/0238731 A1 Aug. 28, 2014

(51) Int. Cl.
| | |
|---|---|
| H01G 4/228 | (2006.01) |
| H05K 3/00 | (2006.01) |
| H01G 4/33 | (2006.01) |
| H01G 4/30 | (2006.01) |
| H01G 4/008 | (2006.01) |
| H01G 4/01 | (2006.01) |

(Continued)

(52) U.S. Cl.
CPC .............. *H05K 3/0014* (2013.01); *B29C 47/00* (2013.01); *B29C 47/0019* (2013.01); *B29C 47/062* (2013.01); *B29C 47/128* (2013.01); *H01G 4/008* (2013.01); *H01G 4/01* (2013.01); *H01G 4/206* (2013.01); *H01G 4/30* (2013.01); *H01G 4/33* (2013.01)

(58) Field of Classification Search
CPC .. H05K 3/0014; H05K 1/0298; H05K 1/0306
USPC .......... 361/299.1, 299.5–298.4, 301.1, 301.4, 361/306.1, 306.3, 307, 307.8
See application file for complete search history.

(56) References Cited

U.S. PATENT DOCUMENTS

| | | | | |
|---|---|---|---|---|
| 5,487,277 | A | * | 1/1996 | Bessler ........................... 62/187 |
| 5,548,474 | A | * | 8/1996 | Chen et al. .................... 361/313 |

(Continued)

FOREIGN PATENT DOCUMENTS

WO 2010-078666 7/2010

OTHER PUBLICATIONS

PCT International Search Report for PCT/US2014/016360, mailed May 27, 2014.

(Continued)

*Primary Examiner* — Hoa C Nguyen (57) ABSTRACT

An interdigitated electrode film co-extruded with bus bars for thin film electronics or other devices. First electrode layers are located between first and second major surfaces of the film with a first bus bar electrically connecting and integrated with the first electrode layers. Second electrode layers are located between the first and second major surfaces with a second bus bar electrically connecting and integrated with the second electrode layers. The first electrode layers are interdigitated with the second electrode layers, and insulating layers electrically isolate the first bus bar and electrode layers from the second bus bar and electrode layers. The electrode films include multilayer films with vertical bus bars and multilane films with horizontal bus bars.

26 Claims, 4 Drawing Sheets

(51) Int. Cl.
    *H01G 4/20*     (2006.01)
    *B29C 47/00*     (2006.01)
    *B29C 47/06*     (2006.01)
    *B29C 47/12*     (2006.01)

(56) References Cited

U.S. PATENT DOCUMENTS

| | | | |
|---|---|---|---|
| 5,997,800 | A | 12/1999 | Friedl |
| 6,202,471 | B1* | 3/2001 | Yadav et al. .................. 73/31.05 |
| 6,404,101 | B1 | 6/2002 | Taniguchi |
| 6,827,886 | B2 | 12/2004 | Neavin |
| 6,829,135 | B2* | 12/2004 | Honda et al. ............... 361/306.1 |
| 7,324,326 | B2 | 1/2008 | Suzuki |
| 7,580,241 | B2* | 8/2009 | Sakashita ..................... 361/313 |
| 7,777,397 | B2 | 8/2010 | Bharti |
| 8,067,094 | B2 | 11/2011 | Benson |
| 8,611,068 | B2 | 12/2013 | Baer |
| 2005/0046030 | A1 | 3/2005 | Nakamura |
| 2008/0316678 | A1* | 12/2008 | Ehrenberg et al. ............ 361/503 |
| 2009/0310209 | A1 | 12/2009 | Aschwanden |
| 2010/0226066 | A1* | 9/2010 | Sweeney et al. .............. 361/305 |
| 2012/0033342 | A1* | 2/2012 | Ito et al. .................... 361/301.4 |
| 2012/0168207 | A1 | 7/2012 | Oh |
| 2012/0321785 | A1* | 12/2012 | Rogers et al. ............. 427/249.1 |

OTHER PUBLICATIONS

Burke, "Ultracapacitors: why, how, and where is the technology", Journal of Power Sources, 2000, vol. 91, pp. 37-50.

Carpi, "Contractile monolithic linear actuators", Chapter 12, Dielectric Elastomers as Electromechanical Transducers, Fundamentals, Materials, Devices, Models and Applications of an Emerging Electroactive Polymer Technology, pp. 123-131, (2008).

Carpi, "Folded Dielectric Elastomer Actuators", Smart Materials and Structures, 2007, vol. 16, pp. S300-S305.

Kofod, "Compliant Electrodes: Solutions, Materials and Technologies", Chapter 7, Dielectric Elastomers as Electromechanical Transducers, Fundamentals, Materials, Devices, Models and Applications of an Emerging Electroactive Polymer Technology, pp. 69-76, (2008).

Kujawski, "PDMS/Graphite Stretchable Electrodes for Dielectric Elastomer Actuators", Proceedings SPIE, 2010, vol. 7642, pp. 76420R-1-76420R-9.

Lavall, "Novel Polymer Electrolytes Based on Thermoplastic Polyurethane and Ionic Liquid/Lithium bis(trifluoromethanesulfonyl)imide/propylene Carbonate Salt System", Journal of Power Sources, 2010, vol. 195, pp. 5761-5767.

Schlaak, "Multilayer Stack Contractile Actuators", Chapter 11, Dielectric Elastomers as Electromechanical Transducers, Fundamentals, Materials, Devices, Models and Applications of an Emerging Electroactive Polymer Technology, pp. 109-122, (2008).

Wallace, "Organic Bionics", Proceedings of SPIE, 2010, vol. 7642, pp. 764202-1- 764202-5.

Wang, "Solid Polymer Electrolytes of Blends of Polyurethane and Polyether Modified Polysiloxane and Their Ionic Conductivity", Polymer, 2010, Vo. 51, pp. 2621-2628.

Yang, "Experimental Study on Sensing Capability of Fibre Optic and Piezoceramic Sensors for Load Monitoring", Proc. Of SPIE, 2009, vol. 7292, pp. 72923S-1-72923S-112.

* cited by examiner

FILM CONSTRUCTIONS FOR INTERDIGITATED ELECTRODES WITH BUS BARS AND METHODS OF MAKING SAME

BACKGROUND

Many common electronic devices can be fabricated in a continuous manner on a flexible substrate. Continuous film-based methods have been demonstrated for complete or partial fabrication of capacitors, resistors, thin film batteries, organic photovoltaics (OPVs), organic light emitting diodes (OLEDs), and other components. However, there are fewer continuous techniques available for producing fully integrated multilayer electronic films, especially those with a large number of layers and electrodes, for example over 100 layers. Also, many thin film electronic devices are produced through multiple vapor deposition and patterning steps. Accordingly, a need exists for complex electrodes and methods to fabricate them.

SUMMARY

A multilayer interdigitated electrode film, consistent with the present invention, has a first major surface, a second major surface opposite the first major surface, an in-plane direction extending along the first and second major surfaces, and a z-direction extending between the first and second major surfaces. A first plurality of electrode layers are located between the first and second major surfaces along the in-plane direction, and a first bus bar electrically connects and is integrated with the first plurality of electrode layers along the z-direction. A second plurality of electrode layers are located between the first and second major surfaces along the in-plane direction, and a second bus bar electrically connects and is integrated with the second plurality of electrode layers along the z-direction. The first plurality of electrode layers are interdigitated with the second plurality of electrode layers, and insulating layers electrically isolate the first bus bar and the first plurality of electrode layers from the second bus bar and the second plurality of electrode layers.

A multilane interdigitated electrode film, consistent with the present invention, has a first major surface, a second major surface opposite the first major surface, an in-plane direction extending along the first and second major surfaces, and a z-direction extending between the first and second major surfaces. A first plurality of electrode layers are located between the first and second major surfaces along the z-direction, and a first bus bar electrically connects and is integrated with the first plurality of electrode layers along the in-plane direction. A second plurality of electrode layers are located between the first and second major surfaces along the z-direction, and a second bus bar electrically connects and is integrated with the second plurality of electrode layers along the in-plane direction. The first plurality of electrode layers are interdigitated with the second plurality of electrode layers, and insulating layers electrically isolate the first bus bar and the first plurality of electrode layers from the second bus bar and the second plurality of electrode layers.

Methods consistent with the present invention include co-extrusion of materials to form the multilayer and multilane interdigitated electrode films.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Embodiments of the present invention include multilayer (and multilane) melt-processable polymeric film constructions and fabrication methods to produce them. The advantages of melt processing in the realm of thin film electronics are two-fold: significant decrease in thickness of individual electrically active layers and a significant increase in electrode surface area. Melt processing in multilayer form can provide, for example, fully integrated electronic films via a single processing method. Additional benefits of multilayer melt processing that are potentially useful for thin film electronics include precise interfacial control, control of adhesion at interfaces, precise thickness control, and high cross- and down-web uniformity.

These techniques and combinations thereof can be used to produce a series of structures with alternating electrode layers. A common feature of these multilayer devices is the presence of both vertical and horizontal electrode segments, the vertical segments aligned with the film axis of smallest dimension, and the horizontal segments aligned along the in-plane direction of the extruded film, although the opposite arrangement is also possible as a multilane electrode film. The constructions are compatible with continuous fabrication methods such as multilayer extrusion and multilane extrusion.

Another advantage of these films is the connection between integrated in-plane electrodes and vertical connecting electrodes along the z-direction of the film. The vertical bus bars stabilize the interdigitated electrode structure to make them electrically stable without short circuits, enable a robust connection to the in-plane electrodes, and provide a way of singulating repeating units of the device structure into individual electrode films. Stabilizing the interdigitated electrodes with vertical bus bars also helps to prevent variable electrode spacing at the edges and electrical short circuits. Another advantage of these films is they can be made by a process that eliminates the need for 3D patterning, printing, or multiple lithographic steps. Applications of these electrode films include, for example, actuators, sensors, and capacitors.

Film Constructions

FIGS. 1-6 show exemplary constructions for multilayer and multilane interdigitated electrode films. As shown, these films have a first major surface, a second major surface opposite the first major surface, and an in-plane direction generally along the first and second major surfaces. The films are described with reference to x-, y-, and z-directions. The x-direction is along the length of the film (or down web direction when making the film), the y-direction is along the width of the film, and the z-direction is along a distance between the first and second major surfaces.

Figure 1:
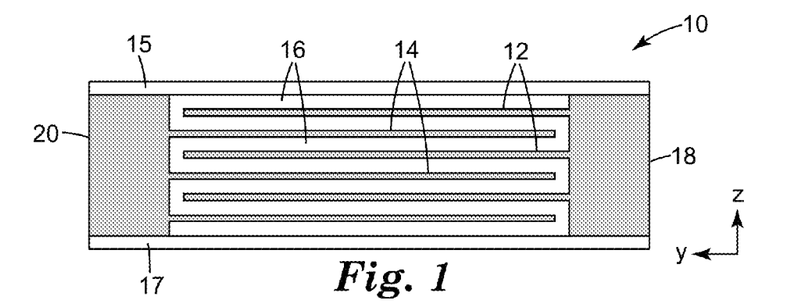
FIG. 1 is a cross-sectional view of a multilayer interdigitated electrode film with buried electrodes and vertical bus bars.
Figure 2:
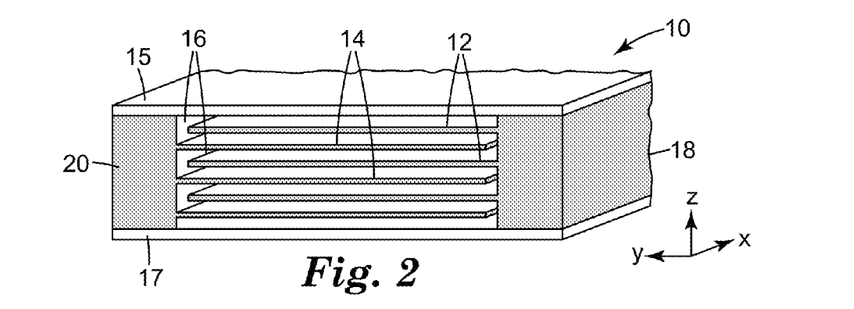
FIG. 2 is a perspective view of the film of FIG. 1.

FIGS. 1 and 2 are cross-sectional and perspective views, respectively, of a multilayer interdigitated electrode film 10 with buried electrodes and vertical bus bars. Film 10 includes electrode layers 12 interdigitated with electrode layers 14 between the major surfaces along the in-plane direction of the film. Insulating layers 16 separate electrode layers 12 from electrode layers 14. A bus bar 18 electrically connects and is integrated with electrode layers 12 at one location between the major surfaces of film 10 along the z-direction, for example an edge of film 10. A bus bar 20 electrically connects and is integrated with electrode layers 14 at another location between the major surfaces of film 10 along the z-direction, for example another edge of film 10. Optional skin layers 15 and 17 can be located on the major surfaces of the film as the outermost layer. Film 10 has buried electrodes in that insulating layers 16 cover the electrode layers 12 and 14 on the outermost layers of the major surfaces of film 10, aside from optional skin layers 15 and 17. Skin layers are layers used to protect the film and can be removed without damaging operation of the film, for example its properties as an electrode. Skin layers 15 and 17 can be formed of the same material or different materials. The skin layers should be non-conductive if they are not removed prior to use of the electrode film.

Figure 3:
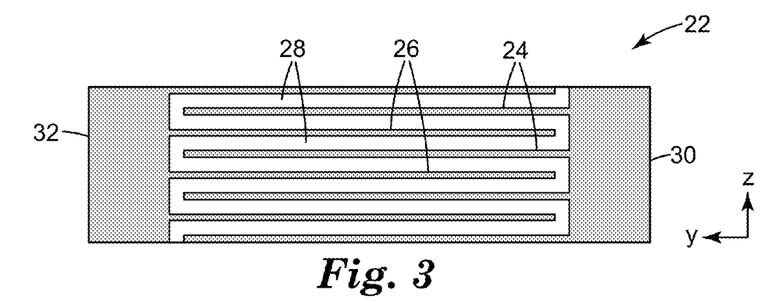
FIG. 3 is a cross-sectional view of a multilayer interdigitated electrode film with exposed electrodes and vertical bus bars.

FIG. 3 is a cross-sectional view of a multilayer interdigitated electrode film 22 with exposed electrodes and vertical bus bars. Film 22 includes electrode layers 24 interdigitated with electrode layers 26 between the major surfaces along the in-plane direction. Insulating layers 28 separate electrode layers 24 from electrode layers 26. A bus bar 30 electrically connects and is integrated with electrode layers 24 at one location between the major surfaces of film 22 along the z-direction, for example an edge of film 22. A bus bar 32 electrically connects and is integrated with electrode layers 26 at another location between the major surfaces of film 22 along the z-direction, for example another edge of film 22. Film 22 has exposed electrodes in that insulating layers 28 do not cover the electrode layers 24 and 26 on the outermost layers of the major surfaces of film 22.

Figure 4:
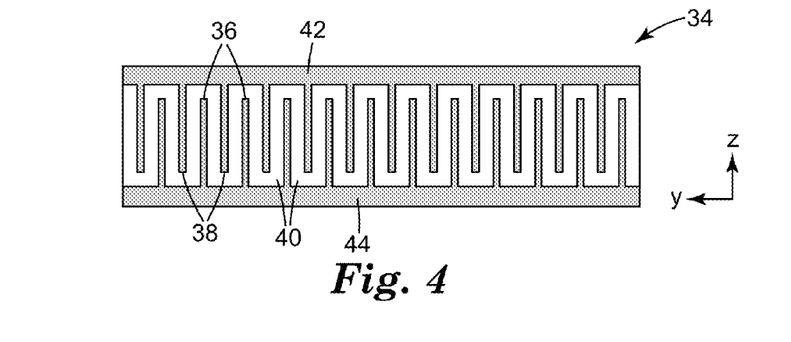
FIG. 4 is a cross-sectional view of a multilane interdigitated electrode film with horizontal bus bars.
Figure 5:
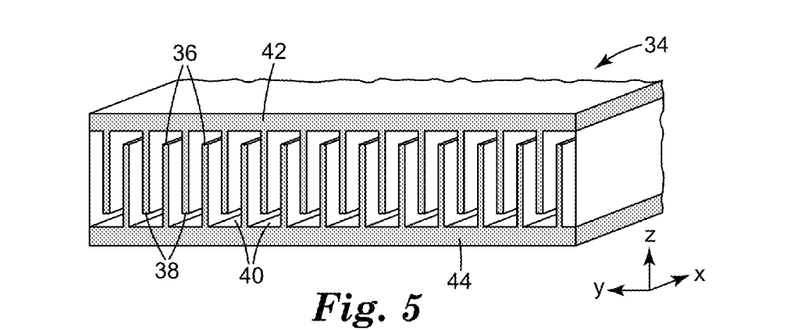
FIG. 5 is a perspective view of the film of FIG. 4.

FIGS. 4 and 5 are cross-sectional and perspective views, respectively, of a multilane interdigitated electrode film 34 with horizontal bus bars. Film 34 includes electrode layers 36 interdigitated with electrode layers 38 between the major surfaces along the z-direction. Insulating layers 40 separate electrode layers 36 from electrode layers 38. A bus bar 44 electrically connects and is integrated with electrode layers 36 on one major surface of film 34 along the in-plane direction, and a bus bar 42 electrically connects and is integrated with electrode layers 38 on the other major surface of film 34 along the in-plane direction.

Figure 6:
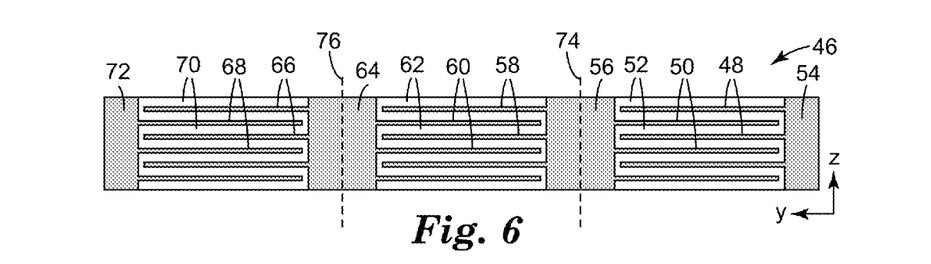
FIG. 6 is a cross-sectional view of a multilayer interdigitated electrode film with vertical bus bars before singulation of the film into separate electrode films.

FIG. 6 is a cross-sectional view of a multilayer interdigitated electrode film 46 with vertical bus bars before singulation of the film. Film 46 includes three sections in this example. The first section includes electrode layers 48 interdigitated with electrode layers 50 between the major surfaces along the in-plane direction. Insulating layers 52 separate electrode layers 48 from electrode layers 50. A bus bar 54 electrically connects and is integrated with electrode layers 48 between the major surfaces along the z-direction, and a bus bar 56 electrically connects and is integrated with electrode layers 50 between the major surfaces along the z-direction.

The second section includes electrode layers 58 interdigitated with electrode layers 60 between the major surfaces along the in-plane direction. Insulating layers 62 separate electrode layers 58 from electrode layers 60. Bus bar 56 electrically connects and is integrated with electrode layers 58 between the major surfaces along the z-direction, and a bus bar 64 electrically connects and is integrated with electrode layers 60 between the major surfaces along the z-direction.

The third section includes electrode layers 66 interdigitated with electrode layers 68 between the major surfaces along the in-plane direction. Insulating layers 70 separate electrode layers 66 from electrode layers 68. Bus bar 64 electrically connects and is integrated with electrode layers 66 between the major surfaces along the z-direction, and a bus bar 72 electrically connects and is integrated with electrode layers 68 between the major surfaces along the z-direction.

Film 46 can be singulated by being cut along score lines 74 and 76 at the common bus bars 56 and 64 to produce three separate multilayer interdigitated electrode films from the three sections. More or fewer sections can be used in order to make a desired number of non-singulated electrode films in a single process, for example.

In the exemplary films shown in FIGS. 1-6, the electrode layers are interdigitated on a one-to-one basis, meaning the adjacent electrode layers alternate between the first and second bus bars. Other types of interdigitation are possible, for example every two electrode layers alternating between the first and second bus bars. The type of interdigitation can be based upon, for example, a desired performance or application of the electrode film. The amount of overlap between the interdigitated electrode layers among the first and second bus bars can also be varied to increase or decrease the amount of overlap to affect the performance of the electrode film, for example.

The bus bars are integrated with the electrode layers, meaning the bus bars and associated electrode layers are a continuous material, set of materials, or blend of materials with additives. This feature means the bus bars and electrodes can be formed in a single processing method, for example, or with fewer processing steps compared with applying the bus bars to the electrode layers after formation of the electrode film.

The electrode layers are implemented with a material having a sufficient electrical conductivity for the film to function as an electrode film. The insulating layers are implemented with a material electrically isolating the interdigitated electrode layers in order for the electrode film to operate as desired or intended. For example, the insulating layers can be used to prevent electrical short circuits between the interdigitated electrodes. The insulating layers can be implemented with a single continuous layer of material, for example, electrically isolating the interdigitated electrode layers. Alternatively, the insulating layers can be multiple layers of the same or different materials joined together to electrically isolated the interdigitated electrodes.

Fabrication of the Films

Fabrication of the interdigitated electrode film constructions can be accomplished with either multilayer extrusion, multilane extrusion, or a combination thereof. Therefore, the exemplary materials to make the films are melt processable, in many cases thermoplastics, and in some cases thermoplastic elastomers.

Figure 7:
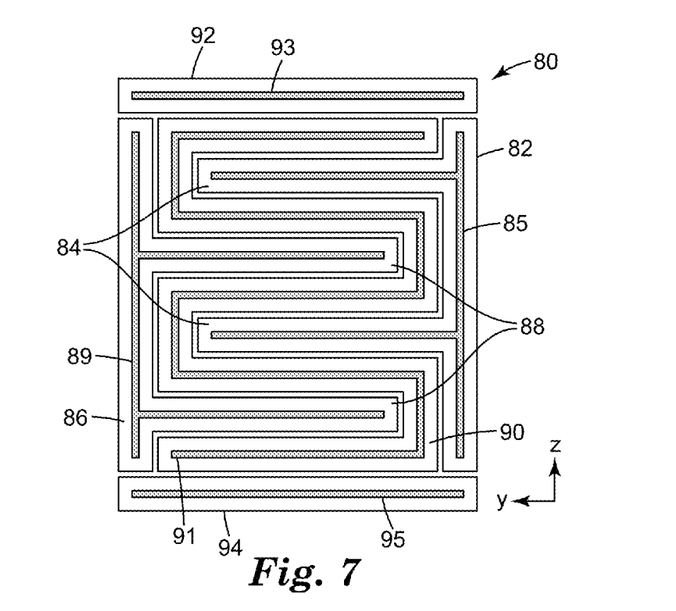
FIG. 7 is a front view of a feedblock for making an interdigitated electrode film with bus bars.
Figure 8:
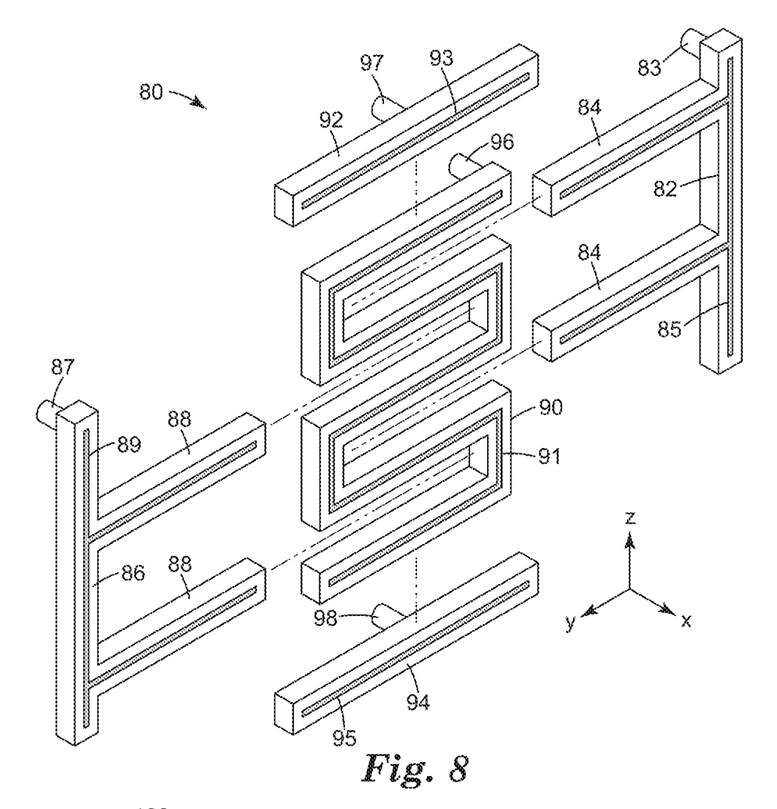
FIG. 8 is a front exploded perspective view of the feedblock of FIG. 7.

FIGS. 7 and 8 are front and exploded perspective views, respectively, of a feedblock 80 for making an interdigitated electrode film with bus bars. Feedblock 80 has several separate blocks that collectively co-extrude the materials to make an interdigitated electrode film. Block 82 extrudes a bus bar, and blocks 84 extrude electrode layers integrated with the bus bar. Blocks 82 and 84 have a common opening 85 to extrude the material for the bus bar and electrode layers. Block 86 extrudes a bus bar, and blocks 88 extrude electrode layers integrated with the bus bar. Blocks 86 and 88 have a common opening 89 to extrude the material for the bus bar and electrode layers. Block 90 extrudes insulating layers between and electrically isolating the interdigitated electrode layers and has an opening 91 to extrude material for the insulating layers. Block 92 extrudes an optional skin layer and has an opening 93 to extrude the material for the skin layer. Block 94 extrudes another optional skin layer and has an opening 95 to extrude the material for the other skin layer. The materials from these blocks can be co-extruded simultaneously during at least a portion of the process to make the electrode film as an integrated article.

As illustrated in FIG. 8, each of the blocks has a port to receive the materials for extrusion. Blocks 82 and 84 have a port 83. Blocks 86 and 88 have a port 87. Block 90 has a port 96. Blocks 92 and 94 have ports 97 and 98, respectively. Only one port is shown for each block for illustrative purposes only. The blocks can have multiple ports fed by a network of pipes behind the feedblock providing the materials for extrusion. The number and location of the ports can be selected to provide, for example, a uniform or desired extrusion of material from each of the blocks. Blocks 82, 86, and 90 can be adjusted in the z-direction, using the same or similar construction, to provide for more or fewer electrode and insulating layers. Also, blocks 82, 86, and 90 can be adjusted in the y-direction to provide for more or less overlap between electrode layers or to adjust the width of the electrode film.

In use, these blocks are typically held together in a frame to help control layer formation during the co-extrusion of material from the blocks. One or more sources of material provide the materials for the electrode layers, insulating layers, and optional skin layers to the ports of the blocks. The material is provided under process conditions providing for co-extrusion of the materials to form the desired interdigitated electrode film with integrated bus bars. In particular, feedblock 80 can co-extrude a multilayer interdigitated electrode film with optional skin layers to make a film having the exemplary construction shown in FIGS. 1 and 2. Feedblock 80 can also be used to co-extrude a multilane interdigitated electrode film having the exemplary construction shown in FIGS. 4 and 5, if blocks 92 and 94 for the optional skin layers are removed.

The process conditions for co-extrusion can depend upon the materials used for the conductive and insulating layers. Generally, extrusion conditions are chosen to adequately feed, melt, mix and pump the material streams in a continuous and stable manner. Final melt stream temperatures are chosen within a range which avoids freezing, crystallization or unduly high pressure drops at the low end of the temperature range and which avoids degradation at the high end of the temperature range.

Figure 9:
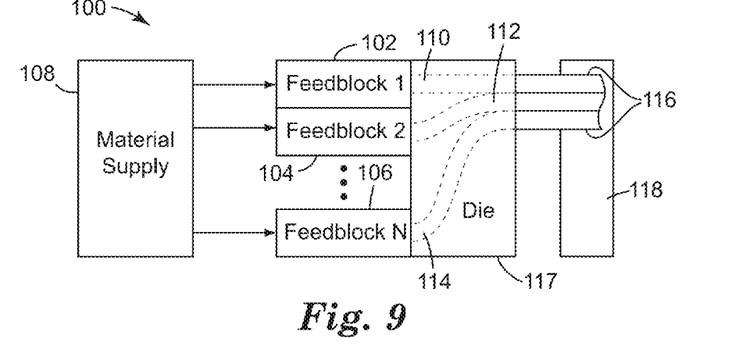
FIG. 9 is a top view block diagram of a system for making an interdigitated electrode film with bus bars.
Figure 10:
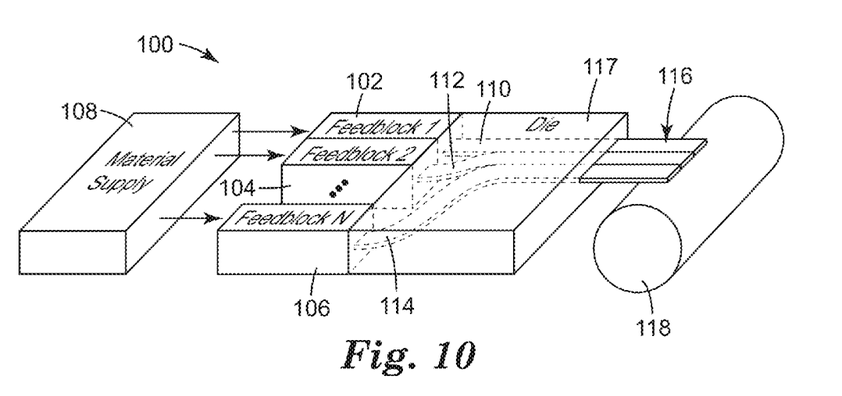
FIG. 10 is a perspective view of the system of FIG. 9.

FIGS. 9 and 10 are top and perspective views, respectively, of a block diagram of a system 100 for making multiple unsingulated interdigitated electrode films with integrated bus bars. System 100 includes several feedblocks 102, 104, and 106 used to co-extrude melt streams forming interdigitated electrode films 110, 112, and 114, respectively. A material supply 108 provides the materials to feedblocks 102, 104, and 106 required to co-extrude the films, and a die 117 combines the individual melt streams (electrode films, 110, 112, and 114). The co-extruded films 110, 112, and 114 from die 117 collectively form an unsingulated film 116, which can be wound on a take up roll 118. Feedblocks 102, 104, and 106 may correspond with feedblock 80 and be joined together in the z-direction at the blocks used to make the bus bars. By combining the feedblocks at those blocks, the feedblocks can collectively co-extrude multiple multilayer interdigitated electrode films 116 having common integrated vertical bus bars at the locations where the feedblocks are joined together. An example of film 116 is shown in the exemplary film construction of FIG. 6, which would result from joining together three of feedblocks 80. More or fewer feedblocks can be joined together to co-extrude a desired number of unsingulated interdigitated electrode films. The optional skin layers can be used to protect film 116 as it is wound on take up roll 118, for example. Also, system 100 can optionally include one or more multipliers, which separate a melt stream and recombine it by stacking the separated portions on one another. An example of a multiplier is disclosed in U.S. Pat. No. 6,827,886, which is incorporated herein by reference as if fully set forth.

Materials for Fabrication

Layer formulations for the interdigitated electrode films may comprise a thermoplastic host polymer that provides common mechanical, physical, and chemical properties to the layers. For example, a single thermoplastic host can be mixed, blended, or otherwise combined with conductive materials (e.g., conductive polymers, conductive nanomaterials, metallic nanomaterials including silver and copper, particles, flakes, wires or whiskers; metal oxide particles, flakes or nanoparticles, nanorods, etc.; carbon nanoparticles, dispersable graphenes or single- or multi-walled carbon nanotubes) to provide a thermoplastic conductor and this same or another thermoplastic host can be mixed, blended, or otherwise combined with high permittivity nanoparticles (e.g., barium titanate) to provide a superior dielectric material. In another example, a thermoplastic elastomer (e.g. silicone polyoxamide or other TPE) may be combined, mixed or blended with conductive additives to give a compliant conductive extrudable material; and likewise may be mixed with high permittivity additives to give a complaint dielectric material. Materials that are useful to film making via extrusion, that could also be a host to conductive or dielectric additives include ABS, Acrylics, cellulosics, COC, EVA, EVOH, Polyamides, Polyesters, Polyurethanes, PP, PE, PC, PEEK, PEI, PS, PVC, Fluoropolymers (PTFE), polysulfone, SAN.

At least one of the polymeric materials can be elastomeric. Thermoplastic materials that have elastomeric properties are typically referred to thermoplastic elastomers (TPEs). Thermoplastic elastomers are generally defined as materials that exhibit high resilience and low creep as though they were covalently crosslinked at ambient temperatures, yet process similar to traditional thermoplastics and flow when heated above their softening point. TPEs typically have a Tg below room temperature, and often below 0° C.; whereas, traditional thermoplastics typically have a Tg above room temperature, and often near 100° C. Thermoplastic elastomeric materials useful in the conductive electrode layers, the nonconductive insulating layers, or both as a first polymeric material or one of a mixture or blend of polymeric materials include, for example, linear, radial, star, and tapered block copolymers such as those described below. Examples of such a polymeric material include silicone elastomers, acrylic elastomers, polyurethanes, polybutadienes, thermoplastic elastomers, polybutadiene-acrylonitrile copolymers, materials such as styrene ethylene butadiene styrene sold under the KRATON trade name, and combinations thereof.

At least one of the polymeric materials can be a thermoplastic. Examples of a thermoplastic polymeric material include pressure sensitive adhesives, fluoropolymers and polymers comprising silicone and acrylic moieties, polyesters, PENs, PETs, polypropylene and polyethylene, and the like. Examples of fluoropolymers include homopolymers such as polyvinylidene difluoride (PVDF), copolymers such as polyvinylidene fluoride-trifluoroethylene P(VDF-TrFE), and the like.

Materials for the electrode layers fall into three categories: inherently conductive polymers or mixtures thereof, dispersions of compatibilized conductors (e.g., dispersed graphenes) in a polymer, and conductive nanoparticle filled polymers.

Examples of a intrinsically conductive polymers include poly(3,4-ethylenedioxy thiophene), polyaniline, polypyrrole, polythiophene, polyacetylene, copolymers of and physical mixtures thereof. In some cases, these conducting polymers can be melt processed neat, and in other cases must be blended with traditional thermoplastic or thermoplastic elastomer materials to provide an extrudable composition. The polymeric materials and blends can be made more conductive with optional particles or fillers. For example, a thermoplastic host can be doped with conductive materials (e.g., dispersed graphene, exfoliated graphite, carbon nanofoam, or single walled carbon nanotubes) to provide a thermoplastic conductor.

Mixtures or blends of polymeric materials can be utilized to form the nonconductive insulating layers. Additives to increase the dielectric constant of the insulating layers may be added or compounded with the polymeric material of the nonconductive layers. Examples additives include $BaTiO_3$, lead zirconate titanate (PZT), PT (lead titanate) and PT composites, and combinations thereof other examples include zirconia, exfoliated clays, and the like.

Solid polymer electrolytes (SPEs) are mixtures that may include ionic polymers, ionic liquids, salts, polar polymers, or non-polar polymers. One or more of the polymers in the SPE of embodiments of the present invention can be a thermoplastic. SPEs alone or in combination with conductive additives can increase the conductivity of the resulting composite through the combination of ionic host conductivity and electronic additive conductivity.

Materials for fabrication are also disclose in U.S. Pat. No. 8,067,094, which is incorporated herein by reference as if fully set forth.

The invention claimed is:

1. A multilayer interdigitated electrode film having a first major surface, a second major surface opposite the first major surface, an in-plane direction extending along the first and second major surfaces, and a z-direction extending between the first and second major surfaces, the film comprising:
   a first plurality of electrode layers between the first and second major surfaces along the in-plane direction;
   a first bus bar electrically connecting and integrated with the first plurality of electrode layers along the z-direction;
   a second plurality of electrode layers between the first and second major surfaces along the in-plane direction;
   a second bus bar electrically connecting and integrated with the second plurality of electrode layers along the z-direction; and
   a plurality of insulating layers between the first and second plurality of electrode layers, the plurality of insulating layers electrically isolating the first bus bar and the first plurality of electrode layers from the second bus bar and the second plurality of electrode layers,
   wherein the first plurality of electrode layers are interdigitated with the second plurality of electrode layers,
   wherein the first plurality of electrode layers, the first bus bar, the second plurality of electrode layers, the second bus bar, and the plurality of insulating layers all comprise an extrudable material.

2. The film of claim 1, wherein one of the first plurality of electrode layers comprises a first outermost layer on the first major surface, and one of the second plurality of electrode layers comprises a second outermost layer on the second major surface.

3. The film of claim 1, wherein one of the plurality of insulating layers comprises a first outermost layer on the first major surface, and another one of the plurality of insulating layers comprises a second outermost layer on the second major surface.

4. The film of claim 1, further comprising a first skin layer on the first major surface and a second skin layer on the second major surface.

5. The film of claim 4, wherein the first and second skin layers are removable without damaging operation of the film.

6. The film of claim 1, wherein the first and second plurality of electrode layers comprise a conductive polymer.

7. The film of claim 1, wherein the plurality of insulating layers comprise a thermoplastic polymer.

8. The film of claim 1, wherein the first and second plurality of electrode layers comprise a polymer with conductive nanoparticles.

9. The film of claim 1, wherein the plurality of insulating layers comprise a polymer with high permittivity nanoparticles.

10. The film of claim 1, further comprising:
    a third plurality of electrode layers between the first and second major surfaces along the in-plane direction, wherein the second bus bar electrically connects and is integrated with the third plurality of electrode layers along the z-direction on a side of the second bus bar opposite the second plurality of electrode layers;
    a fourth plurality of electrode layers between the first and second major surfaces along the in-plane direction;
    a third bus bar electrically connecting and integrated with the fourth plurality of electrode layers along the z-direction; and
    another plurality of insulating layers between the third and fourth plurality of electrode layers, the another plurality of insulating layers electrically isolating the second bus bar and the third plurality of electrode layers from the third bus bar and the fourth plurality of electrode layers,
    wherein the third plurality of electrode layers are interdigitated with the fourth plurality of electrode layers.

11. A multilane interdigitated electrode film having a first major surface, a second major surface opposite the first major surface, an in-plane direction extending along the first and second major surfaces, and a z-direction extending between the first and second major surfaces, the film comprising:
    a first plurality of electrode layers between the first and second major surfaces along the z-direction;
    a first bus bar electrically connecting and integrated with the first plurality of electrode layers along the in-plane direction;
    a second plurality of electrode layers between the first and second major surfaces along the z-direction;
    a second bus bar electrically connecting and integrated with the second plurality of electrode layers along the in-plane direction; and
    a plurality of insulating layers between the first and second plurality of electrode layers, the plurality of insulating layers electrically isolating the first bus bar and the first plurality of electrode layers from the second bus bar and the second plurality of electrode layers,
    wherein the first plurality of electrode layers are interdigitated with the second plurality of electrode layers, wherein the first plurality of electrode layers, the first bus bar, the second plurality of electrode layers, the second bus bar, and the plurality of insulating layers all comprise an extrudable material.

12. The film of claim 11, wherein the first and second plurality of electrode layers comprise a conductive polymer.

13. The film of claim 11, wherein the plurality of insulating layers comprise a thermoplastic polymer.

14. The film of claim 11, wherein the first and second plurality of electrode layers comprise a polymer with conductive nanoparticles.

15. The film of claim 11, wherein the plurality of insulating layers comprise a polymer with high permittivity nanoparticles.

16. A method of making a multilayer interdigitated electrode film having a first major surface, a second major surface opposite the first major surface, an in-plane direction extending along the first and second major surfaces, and a z-direction extending between the first and second major surfaces, the method comprising:

extruding a first plurality of electrode layers along the in-plane direction and a first bus bar electrically connecting and integrated with the first plurality of electrode layers along the z-direction;

extruding a second plurality of electrode layers along the in-plane direction and a second bus bar electrically connecting and integrated with the second plurality of electrode layers along the z-direction; and extruding a plurality of insulating layers between the first and second plurality of electrode layers, the plurality of insulating layers electrically isolating the first bus bar and the first plurality of electrode layers from the second bus bar and the second plurality of electrode layers, wherein the first plurality of electrode layers are interdigitated with the second plurality of electrode layers, wherein the extruding steps collectively comprise simultaneously co-extruding the first plurality of electrode layers and the first bus bar with the second plurality of electrode layers and the second bus bar and with the plurality of insulating layers to make the electrode film.

17. The method of claim 16, wherein the first and second plurality of electrode layers comprise a conductive polymer.

18. The method of claim 16, wherein the plurality of insulating layers comprise a thermoplastic polymer.

19. The method of claim 16, wherein the first and second plurality of electrode layers comprise a polymer with conductive nanoparticles.

20. The method of claim 16, wherein the plurality of insulating layers comprise a polymer with high permittivity nanoparticles.

21. A method of making a multilane interdigitated electrode film having a first major surface, a second major surface opposite the first major surface, an in-plane direction extending along the first and second major surfaces, and a z-direction extending between the first and second major surfaces, the method comprising:

extruding a first plurality of electrode layers along the z-direction and a first bus bar electrically connecting and integrated with the first plurality of electrode layers along the in-plane direction;

extruding a second plurality of electrode layers along the z-direction and a second bus bar electrically connecting and integrated with the second plurality of electrode layers along the in-plane direction; and extruding a plurality of insulating layers between the first and second plurality of electrode layers, the plurality of insulating layers electrically isolating the first bus bar and the first plurality of electrode layers from the second bus bar and the second plurality of electrode layers, wherein the first plurality of electrode layers are interdigitated with the second plurality of electrode layers, wherein the extruding steps collectively comprise simultaneously co-extruding the first plurality of electrode layers and the first bus bar with the second plurality of electrode layers and the second bus bar and with the plurality of insulating layers to make the electrode film.

22. The method of claim 21, wherein the first and second plurality of electrode layers comprise a conductive polymer.

23. The method of claim 21, wherein the plurality of insulating layers comprise a thermoplastic polymer.

24. The method of claim 21, wherein the first and second plurality of electrode layers comprise a polymer with conductive nanoparticles.

25. The method of claim 21, wherein the plurality of insulating layers comprise a polymer with high permittivity nanoparticles.

26. A multilayer interdigitated electrode film having a first major surface, a second major surface opposite the first major surface, an in-plane direction extending along the first and second major surfaces, and a z-direction extending between the first and second major surfaces, the film comprising:

a first electrode layer between the first and second major surfaces along the in-plane direction;

a first bus bar electrically connecting and integrated with the first electrode layer along the z-direction;

a plurality of second electrode layers between the first and second major surfaces along the in-plane direction;

a second bus bar electrically connecting and integrated with the plurality of second electrode layers along the z-direction; and a plurality of insulating layers between the first electrode layer and the plurality of second electrode layers, the plurality of insulating layers electrically isolating the first bus bar and the first electrode layer from the second bus bar and the plurality of second electrode layers, wherein the first electrode layer is interdigitated with the plurality of second electrode layers, wherein the first electrode layer, the first bus bar, the second plurality of electrode layers, the second bus bar, and the plurality of insulating layers all comprise an extrudable material.

* * * * *